US009866158B2

(12) United States Patent
Lamsahel

(10) Patent No.: US 9,866,158 B2
(45) Date of Patent: Jan. 9, 2018

(54) METHOD AND ARRANGEMENT FOR MONITORING A PERMANENTLY EXCITED SYNCHRONOUS MACHINE

(71) Applicant: ZF Friedrichshafen AG, Friedrichshafen (DE)

(72) Inventor: Hassan Lamsahel, Friedrichshafen (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 0 days.

(21) Appl. No.: 15/445,425

(22) Filed: Feb. 28, 2017

(65) Prior Publication Data

US 2017/0250631 A1    Aug. 31, 2017

(30) Foreign Application Priority Data

Feb. 29, 2016  (DE) .................. 10 2016 203 273

(51) Int. Cl.
*H02P 21/00*  (2016.01)
*H02P 6/16*  (2016.01)
*H02P 21/22*  (2016.01)
*G01R 31/34*  (2006.01)

(52) U.S. Cl.
CPC .............. *H02P 6/16* (2013.01); *G01R 31/343* (2013.01); *H02P 21/22* (2016.02)

(58) Field of Classification Search
CPC .. H02P 6/16; H02P 21/22; H02P 21/06; H02P 21/08; H02P 21/10; H02P 21/12; H02P 21/14; H02P 23/14; H02P 25/20; H02P 27/08; H02P 1/00; H02P 3/00; H02P 4/00; H02P 5/00; H02P 27/04; H02P 21/00; H02P 1/24; H02P 1/42; H02P 5/48; G01R 31/343

USPC .... 318/400.01, 400.02, 400.14, 400.15, 599, 318/700, 721, 727, 799, 800, 801, 432;
(Continued)

(56) References Cited

U.S. PATENT DOCUMENTS

| | | |
|---|---|---|
| 2004/0046519 A1 | 3/2004 | Leonardi et al. |
| 2013/0043816 A1 | 2/2013 | Welchko et al. |
| 2015/0214875 A1* | 7/2015 | Matsui .................... H02P 6/147 318/400.13 |

FOREIGN PATENT DOCUMENTS

| | | |
|---|---|---|
| DE | 103 38 211 A1 | 4/2004 |
| DE | 10 2012 212 247 A1 | 3/2013 |

OTHER PUBLICATIONS

German Search Report dated Apr. 26, 2016 for German Patent Application No. 10 2016 203 273.9 (German language with two-page English explanations) (9 pp.).

* cited by examiner

*Primary Examiner* — Antony M Paul
(74) *Attorney, Agent, or Firm* — Brinks Gilson & Lione

(57) ABSTRACT

The present disclosure provides a method for monitoring a rotor position sensor of a PSM machine having at least three phases operated by a field oriented control, where the electrical angle of the PSM machine may corresponds with a rotor position. A first calculation of the electrical angle of the PSM machine may be based on a measured mechanical rotor position and the pole-pair number of the PSM machine. A second calculation of the electrical angle of the PSM machine may be based on the phase of a phase current indicator and regulated target currents in the d,q-coordinate system. The method may include a comparison of the values of the respective electrical angles of the PSM machine determined by the first calculation and the second calculation.

16 Claims, 6 Drawing Sheets

(58) Field of Classification Search
USPC .......... 388/800, 819, 821; 363/21.1, 40, 44, 363/120, 175
See application file for complete search history.

METHOD AND ARRANGEMENT FOR MONITORING A PERMANENTLY EXCITED SYNCHRONOUS MACHINE

CROSS-REFERENCE TO RELATED APPLICATION

This application is based on and claims priority to the German patent application No. 10 2016 203 273.9, filed on Feb. 29, 2016, which is incorporated herein by reference in its entirety.

TECHNICAL FIELD

The present disclosure relates to a method for monitoring a rotor position sensor of a PSM machine and an assembly for monitoring a rotor position sensor of a PSM machine.

BACKGROUND

Permanently excited synchronous motors, also referred to as PSM machines, are used on board a motor vehicle for various purposes, e.g. for a steering force assistance, a traction drive, or other drives. A PSM machine is an induction machine having a permanent magnet disposed in or on the rotor. The at least one stator comprises windings of three or more phases, and forms phases therefrom, distributed at an angle of 120°. The coils of the phases are distributed on a circumference about a rotational axis, opposite which the rotor is rotatably supported in relation to the stator.

The state variables of the PSM machine, e.g. current, voltage, flux, etc., can be plotted in the three-coordinate system (U, V, W), as is shown in FIG. 1. FIG. 1 shows an induction machine, comprising a stator (not shown) and a rotor 101, which are supported such that they can rotate in relation to one another with respect to a rotational axis 102. At least three coils are evenly distributed on the stator at 120° on a circumference surrounding the rotational axis 102. Three phases U, V, and W are provided. Each of the phases U, V, W is normally connected to the same number of coils, which are distributed on the circumference at equal spacings. The pole-pair number $Z_P$ and the number of coils connected thereto can be selected depending on the application. Preferably at least one permanent magnet 103 is disposed on the rotor 101, wherein a torque is generated when the phases U, V, W are activated with out-of-phase alternating currents, which rotates the rotor 101 about the rotational axis 102 in relation to the stator.

An out-of-phase activation of the phases U, V, W can be plotted in different coordinate systems. In stationary stator U, V, W-coordinate systems, the coordinate axes are rotated 120° in relation to one another. Because the currents of the phases U, V, W add up to zero, a current indicator, or current vector $\vec{I}_s$ can also be plotted in a two-dimensional α/β coordinate system. Furthermore, a stationary rotor d,q-coordinate system is provided in FIG. 1, the d-component of which runs such that it is rectified with the magnetic flux ΨPM of the permanent magnet 103. A q-component runs perpendicular thereto. An angle between the d axis and the α, or U axis corresponds to an electrical rotational angle θd or θel of the induction machine 100 between the rotor 101 and the stator. An electrical rotational angle Θd or Θel corresponds to the mechanical rotational angle Θmech multiplied times the pole-pair number $Z_P$. With the transformation of the state variables into the d, q-coordinate system, the differential equations of the PSM machine are simplified, and the PSM machine can be regulated like a direct current machine. This is referred to as field oriented regulation, of FOR. With a field oriented regulation, a total target current that is to flow through the induction machine is determined in relation to a stationary rotor (flux) d,q-coordinate system, such that some control or regulating procedures can be executed more easily, and some calculations are simplified.

FIG. 2 shows the FOR of a PSM machine in an overview. A control component 205 generates a total target current $I_{sd}$, $I_{sq}$ of the induction machine 100 d- and q-components of a voltage $U_{sd}$, $U_{sq}$ based on the given d- and q-components. The d and q components $I_{sd}$, $I_{sq}$ span a current vector that corresponds to the total target current. The voltage generated in the control component 205 and expressed by the d- and q-components $U_{sd}$, $U_{sq}$ is converted from the d, q-coordinate system into a three-dimensional coordinate system, in particular the U, V, W coordinate system, by means of a converter 210. Three voltages $U_{s1}$, $U_{s2}$, $U_{s3}$ are obtained thereby, that are converted into three corresponding pulse width modulation signals $PWM_1$, $PWM_2$, $PWM_3$ by means of a vector modulator 215 on the basis of DC link voltage $U_{dc}$. The DC link voltage $U_{dc}$ can correspond to an on-board voltage or a battery voltage when used in a motor vehicle. A pulse inverter 220 is configured to alternately connect each of the phases U, V, W to a high and a low potential of the DC link voltage $U_{dc}$, such that a desired voltage is set at the phases U, V, W. The applied voltages cause actual phase currents through the phases U, V, and W. At least one actual phase current is sampled by means of a sampling device 225, which also comprises current sensors. The electrical angle Θel of the PSM is determined via a position sensor 230, based on the measured rotor position Θmech and the pole-pair number ZP, as follows:

$$\theta_{el} = Z_p \cdot \theta_{mech} \quad \text{(Eq. 1)}.$$

In order to compensate for the reciprocal effects of the two currents Isd and Isq, decouplings 240 can be inserted.

Aside from the induction machine 100, the pulse inverter 220, the sampling device having the current sensor(s) 225 and the position sensor 23, the depicted elements or blocks, respectively, are normally executed as method steps of a method, which runs on a processing device, which preferably comprises a programmable microcomputer. Incoming signals are normally sampled by means of analog/digital converters, and signals that are to be created are outputted either digitally, by means of a drive module, or as analog signals, by means of a digital/analog converter. Both the control device as well as the depiction of a method can be referred to in this regard.

For the execution of the FOR, in addition to the current sensors and the DC link voltage, data regarding the rotor position are also needed, in order to obtain the transformations into the coordinate system according to FIG. 1. This is important with regard to being able to determine the correct position of the permanent flux, and to obtain a precise formation of the torque with a low phase current value (and thus with high efficiency). If the position of the rotor is wrong, this can lead to the generation of a low torque, or in the worst case, to opposing torques. This is very dangerous for some applications, e.g. steering or electric mobility, etc., because in these cases, instead of a machine being accelerated in one direction, it could be stopped, and moved in the other direction, which could lead to accidents. For this reason, a position sensor (or rotational rate sensor) for measuring the position of the rotor is very important, and indispensable.

The functionality of the position sensor can, however, be compromised by various effects. With a total malfunction of the sensor, or with a partial malfunction, e.g. failure of a channel of the sensor, the position of the sensor cannot be determined or correctly determined. Furthermore, a displacement of the sensor on the shaft, a common error, can lead to an offsetting of the mechanical angle of the rotor, which would result in an erroneous coordinate system, and thus to an uncontrolled state.

A redundant sensor can be installed for monitoring the functionality of the position sensor, such that the two sensors monitor each other. This however increases the costs for the overall system. Alternatively, computer models can be used, for cost reduction purposes as well, that determine the position, which is then compared with the measured sensor position. There are numerous published (e.g. Prof. Dr.-Ing. Dierk Schröder: "Elektrische Antriebe Regelung von Antriebssystemen" ["Electrical Drive Regulation of Drive Systems"], $3^{rd}$ ed. Springer Publishing, TU Munich, 2001) methods for determining the position (Matsui, Wallmarkt, Leonbergerbeobachter, Kalmannfilter, . . . ). These methods are based on EMF (Electro-Magnetic Force), i.e. they require the voltage of the machine induced by the permanent flux and the rotational rate for the calculation thereof. With low rotational rates, and at a standstill, the EMF is very low, and provides no significant results. For this reason, this method is first used above a certain minimum rotational rate. This minimum rotational rate depends on the drive and the sensor system. It normally lies in a range of 10% to 15% of the maximum rotational rate. For lower rotational rates than this minimum rotational rate, the determination of the rotor position with this method may be erroneous. In accordance with the prior art, injection methods, which implant signals with a higher frequency into the machine, can determine the position within this low rotational rate range. The acoustic problems, which cause noises in the current through high frequencies, are disadvantageous.

DESCRIPTION

For at least these reasons, it is an object of the present disclosure to provide a method and an assembly, through which the position of the rotor of a PSM can be determined in a low rotational rate range as well as at a standstill. Acoustic problems should be prevented thereby.

In accordance with the present disclosure, a method is proposed for monitoring a rotor position sensor of a PSM machine having at least or precisely three phases, which are operated by means of a field oriented regulation or control, wherein the electrical angle of the PSM machine, and thus the rotor position, is determined by two different methods, wherein in the first method, a first calculation of the electrical angle of the PSM, based on a measured mechanical rotor position and the pole-pair number of the PSM occurs, in the second method, a second calculation of the electrical angle of the PSM machine, based on the phase of the phase current indicator and regulated target currents in the d-,q-coordinate system occurs, and wherein a comparison of the values of the respective electrical angles of the PSM machine determined by the first and second methods is carried out.

The rotor position can be monitored by means of the proposed calculation of the electrical angle by the second method, even at low rotational rates or at a standstill. Furthermore, there are no disrupting effects, which occurred with prior methods due to the implanting of high frequency signals.

In at least one embodiment, the electrical angle is calculated by the first method as follows: $\Theta_{el1}=Z_P*\Theta_{mech}$ (Eq. 1), wherein ZP is the pole-pair of the PSM machine and $\Theta$mech is the measured mechanical angle, or the measured mechanical rotor position, and wherein the electrical angle is calculated by the second method as follows: $\Theta_{el2}=\Theta_{Is}-\Theta_{Last}$ (Eq. 3), wherein $\Theta_{Last}$ is the load angle of the filtered d-,q-target currents, and $\Theta_{Is}$ is the angle (or phase) of the current indicator of the PSM machine.

In a further embodiment, the load angle is calculated as follows:

$$\Theta_{Last} = \arctan\left(\frac{IsqRefF}{IsdRefF}\right), \qquad (Eq.\ 4)$$

wherein IsdRefF and IsqRefF are the delayed target values of the d, q-currents, and the phase of the current indicator $\Theta_{Is}$ is calculated as follows, when, e.g., only $I_{su}$ and $I_{sv}$ are measured: Isw=−Isu−Isv (Eq. 5), wherein Isw, Isu, and Isv are the phase currents of the at least three phases (U, V, W), and the current components Isα and Isβ in the α,β-coordinate system are obtained from the transformation of phase currents of the PSM machine (100) as follows:

$$\begin{pmatrix} I_{s\alpha} \\ I_{s\beta} \end{pmatrix} = \begin{pmatrix} \frac{2}{3} & -\frac{1}{3} & -\frac{1}{3} \\ 0 & \frac{1}{\sqrt{3}} & -\frac{1}{\sqrt{3}} \end{pmatrix} \begin{pmatrix} I_{su} \\ I_{sv} \\ I_{sw} \end{pmatrix}, \qquad (Eq.\ 6)$$

and wherein the phase of the current indicator $\Theta_{Is}$ therefrom as follows:

$$\theta_{Is} = \arctan\left(\frac{I_{s\alpha}}{I_{s\beta}}\right). \qquad (Eq.\ 7)$$

In another embodiment, a predefined minimum current is applied to the machine to determine the load angle and the phase of the current indicator, wherein the minimum current is calculated as follows, based on the current amplitude of the PSM machine and the d, q-target currents:

$$I_{sAmpl}=\sqrt{I_{sdRef}^2+I_{sqRef}^2} \qquad (Eq.\ 9),$$

wherein, if $I_{sAmpl}<I_{sAmplMin}$, a new $I_{sd}$ target current is defined:

$$I_{sdRefNeu}=-\sqrt{I_{sAmplMin}^2-I_{sqRef}^2} \qquad (Eq.\ 10),$$

wherein, if $I_{sAmpl}\geq I_{sAmplMin}$, the new $I_{sd}$ target current is defined as:

$$I_{sdRefNeu}=I_{sdRef} \qquad (Eq.\ 11).$$

$I_{sdRef}$ is the originally required d-target currents and $I_{sdRefNeu}$ is the newly calculated d-target current for maintaining the minimum current $I_{sAmplMin}$ in the machine.

By providing a minimum current, it is ensured that the load angle and the phase of the current indicator can be determined without, or with only slight, disruptions, e.g. through noise.

In another embodiment, the comparison of the two determined electrical angles occurs through taking the difference of the values determined in the first and second calculations for the electrical angle. In another, wherein, when it has been detected that there is a difference in the two determined electrical angles, an evaluation of the differences occurs, to determine which error has occurred. It is preferred that at least one measure is taken, composed of sending an error signal, shutting down the machine, or changing the machine parameters, based on the detected error.

By providing two electrical angles obtained differently, it is possible in a simple manner, e.g. by subtraction, to detect and evaluate deviations from the normal state of the machine, and take measures to eliminate the error. The manner of evaluation to determine which error has occurred depends on the application thereby. Through taking the average, integration, or other methods for detecting errors, it is possible to determine which error is present. Depending on the type of error, measures can then be taken, ranging from issuing a warning signal to immediate shutting down the application in which the error is present. The selection of the measures taken depends thereby on the application, the type and severity of the error, and is determined by a person skilled in the art.

Moreover, an assembly for monitoring a PSM machine having at least, or precisely, three phases, which are operated by means of a field oriented control, is also provided in the framework of the present disclosure, comprising at least one position sensor, which is configured to determine the rotor position of the PSM machine, a sampling device for sampling the phase current of at least one of the phases, a device for executing the method described above, and a monitoring level, which is configured to evaluate the error, when a deviation has been detected between the values of the electrical angle determined by the first method and the values of the electrical angle determined by the second method.

The device for executing the method preferably comprises at least one device for executing the first calculation of the electrical angle, a device for executing the second calculation of the electrical angle, and a comparison device, which is configured to compare the respective electrical angles calculated in the first and in the second calculations with one another.

The device for executing the method preferably also comprises at least one evaluation device for determining a detected error.

The advantage with the provision of the assembly is that it is possible to use both numerous hardware components as well as one single component, e.g. a microchip, on which the individual method steps are implemented, e.g. as software. Furthermore, the assembly and its designs have the same advantages as those described above for the method.

Further features and advantages of the present disclosure can be derived from the following description, based on the figures in the drawings, which show details according to certain embodiments, and from the claims. The individual features can be implemented in and of themselves, or in numerous combinations and variations.

BRIEF DESCRIPTION OF THE DRAWINGS

Certain embodiments shall be explained below in greater detail, based on the attached drawings.

In the following description of the Figures, identical elements and functions are provided with the same reference symbols.

DETAILED DESCRIPTION

Figure 3:
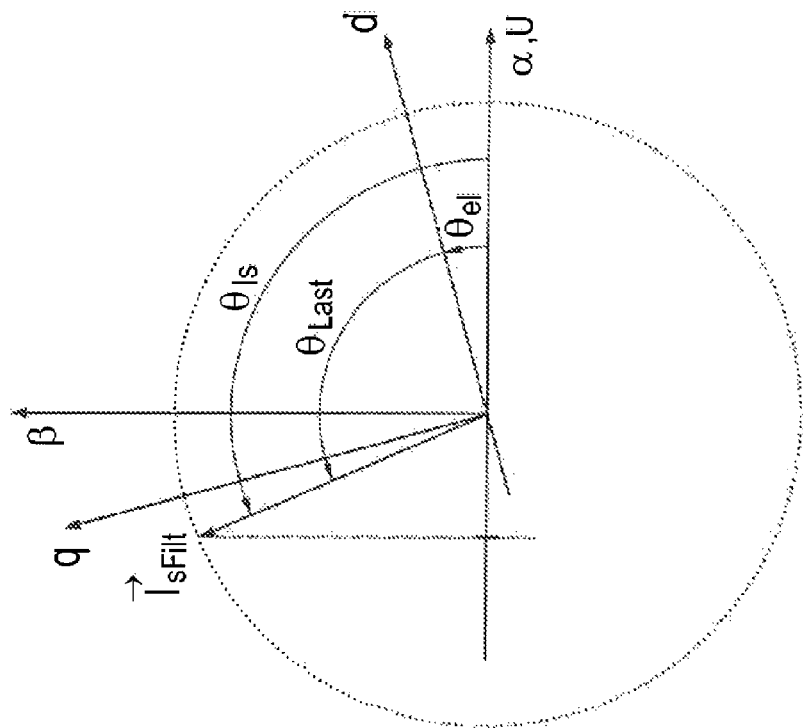
FIG. 3 shows a depiction of different angles in the course of the current vector $\vec{I}_s$ of the PSM.
Figure 1:
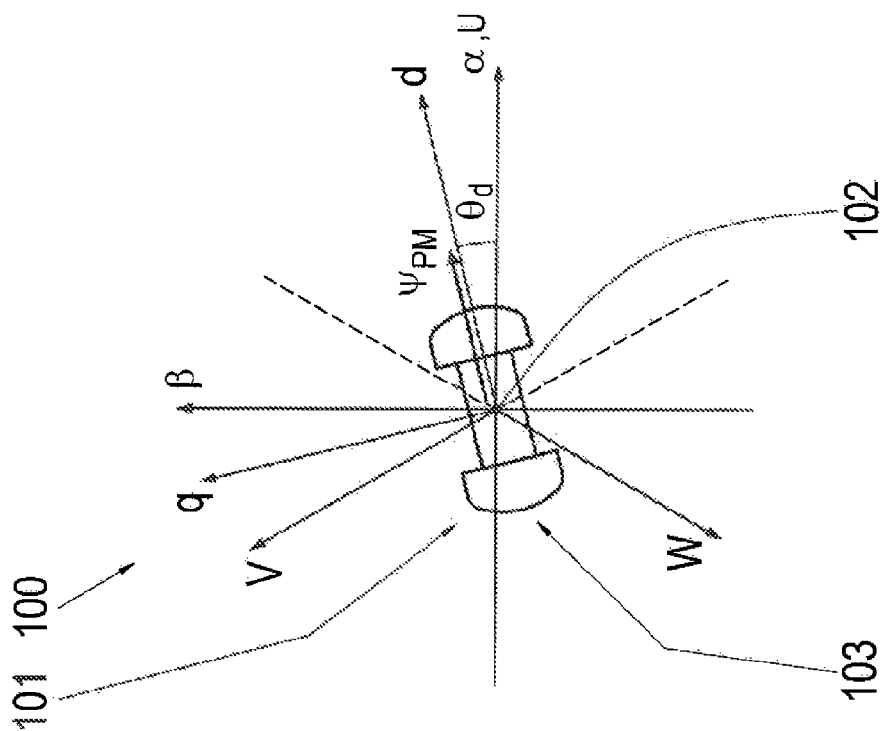
FIG. 1 shows a depiction of different coordinate systems for a PSM.

FIG. 3 shows a depiction of different angles in the course of the current vector $\vec{I}_s$ of the PSM, wherein $\theta_{el}$ is the angle of the electrical angle of the machine, $\theta_{Last}$ is the load angle of the filtered d and q-target currents, and $\theta_{Is}$ is the phase of the current indicator of the machine. The relationship between the load angle $\theta_{Last}$, the electrical angle $\theta_{el}$ and the phase (or the angle) $\theta_{Is}$ of the phase current indicator Is can be derived from FIG. 3:

$$\theta_{Is} = \theta_{el} + \theta_{Last} \quad \text{(Eq. 2).}$$

Thus, the estimated electrical angle $\hat{\theta}_{el}$ can be determined as a function of the two angles, which are calculated over the current:

$$\hat{\theta}_{el} = \theta_{Is} - \theta_{Last} \quad \text{(Eq. 3).}$$

The load angle $\theta_{Last}$ is determined from the filtered target currents in the d and q axes. The FOR has a selected dynamic, i.e. the required d, q-currents are first set after a certain time, wherein the delay of the d, q-current can be reproduced, for example, with a low pass filter 250 (or another suitable filter). The time constant of the low pass filter 250 for each current (d or q) should be selected such that the dynamic of the FOR is reproduced in the respective axis (d or q). This means that the d (or q) target current filtered with the low pass filter 250 should have the same curve as the transformed d (or q) current from the measured phase currents of the machine. The reproduced phase currents of the machine, transformed into the d, q-coordinate system, are obtained through the delayed target values of the d, q-currents $I_{sdRefF}$ and $I_{sqRefF}$. The expected load angle can be calculated from the two currents $I_{sdRefF}$ and $I_{sqRefF}$:

$$\theta_{Last} = \arctan\left(\frac{I_{sdRefF}}{I_{sdRefF}}\right). \quad \text{(Eq. 4)}$$

For the calculation of the phase of the current indicator of the machine, two phase currents (e.g. Isu and Isv) are sufficient. The third phase (e.g. Isw) can be determined from the two known phase currents, e.g.:

$$I_{sw} = -I_{su} - I_{sv} \quad \text{(Eq. 5).}$$

Through a transformation of the phase currents of the machine using Eq. 6, Isα and Isβ, thus the currents in the α, β-coordinate system, can be determined:

$$\begin{pmatrix} I_{s\alpha} \\ I_{s\beta} \end{pmatrix} = \begin{pmatrix} \frac{2}{3} & -\frac{1}{3} & -\frac{1}{3} \\ 0 & \frac{1}{\sqrt{3}} & -\frac{1}{\sqrt{3}} \end{pmatrix} \begin{pmatrix} I_{su} \\ I_{sv} \\ I_{sw} \end{pmatrix}. \quad \text{(Eq. 6)}$$

From this, the phase (or angle) $\theta_{Is}$ of the phase current indicator (or current vector) of the machine can be determined:

$$\theta_{Is} = \arctan\left(\frac{I_{s\alpha}}{I_{s\beta}}\right). \quad \text{(Eq. 7)}$$

It should be noted that with Equation 4 and Equation 7, the denominator can equal zero, such that in these cases, the arctangent can also be determined, depending on the sign of the counter, without division.

Thus, the electrical angle $\theta_{el2}$ can be calculated by a second method, and independently of the mechanical angle $\theta_{mech}$ of the rotor, and compared with the calculated electrical angle $\theta_{el1}$ from Equation 1. By comparing the two electrical angles $\theta_{el1}$ and $\theta_{el2}$ from Equation 1 and Equation 3, the behavior of the machine, in particular the rotor position sensor, can be monitored. If the two electrical angles $\theta_{el1}$ and $\theta_{el2}$ are equal, or deviate only slightly, then the position sensor is functioning correctly. If deviations can be observed, i.e. that a predefined threshold value has been exceeded, for example, these deviations can be evaluated by monitoring levels. There are different methods for evaluating deviations, e.g. taking an average, integration of the deviations over time, etc., for detecting malfunctions. The selected method depends on the application, and is determined by a person skilled in the art.

Furthermore, with the determination of the load angle $\theta_{Last}$ of the filtered d and q-target currents and the phase of the phase current indicator $\theta_{Is}$, it should be noted that a sufficiently high phase current should be present. For this reason, the current of the machine should be increased such that, on one hand, the torque does not change, and on the other hand, sufficient phase current flows in the machine. This is achieved by implanting a blind current $I_{sd}$. Because the blind current $I_{sd}$ is not, or is only negligibly, involved in the generation of the torque, its increase can lead to an increase in the phase current $I_{sd}$ of the machine. Depending on signal measurement noises of the current sensors, the correct resolution of the machine current can first occur at a minimum phase current $I_{sAmplMin}$, such that this minimum current can always been maintained, or ensured, such that the effects of noise on the determination of the current indicator phase $\theta_{Is}$ and the expected load angle $\theta_{Last}$ can be kept low. This can take place in that a current specification can be calculated as a function of the current amplitude $I_{sAmpl}$, in order to ensure that, on one hand, the current amplitude is large enough, and on the other hand, that the torque does not change. The calculation of the electrical torque $T_{el}$ is carried out via Equation 8:

$$T_{el} = \frac{3}{2} \cdot Z_p \cdot \Psi_{PM} \cdot I_{sq} + \frac{3}{2} \cdot Z_p \cdot (L_{sd} - L_{sq}) \cdot I_{sd} \cdot I_{sq}. \quad \text{(Eq. 8)}$$

Because the linked flux is $\Psi_{PM} \gg (L_{sd}-L_{sq})*I_{sd}$, and for small currents, is $I_{sd} \cdot (L_{sd}-L_{sq}) \cdot I_{sd} \approx 0$, the electrical torque of the machine depends only on $I_{sq}$, and the reluctance term $[3/2*Z_p*(L_{sd}-Lsq)*I_{sd}*I_{sq}]$ of the torque can be ignored.

When a machine fulfills the condition $L_{sd}=L_{sq}$, there is actually no reluctance term for the torque. The torque cannot be compromised. When the machine has a reluctance part ($Lsd \neq Lsq$), in Equation 8, the desired torque can be selected via the two currents, such that the minimum current value is obtained. This is only necessary with very small torques. Starting at a torque target value, the current Isq is large enough from the start to maintain the minimum value of the phase current amplitude.

The phase current amplitude $I_{sAmpl}$ can be calculated as follows:

$$I_{sAmpl} = \sqrt{I_{sdRef}^2 + I_{sqRef}^2} \quad \text{(Eq. 9)}.$$

In order to ensure a minimum current $I_{sAmplMin}$ in the machine, the Isd-target value $I_{sdRefNeu}$ can be redefined based on the following equation:

$$I_{sAmpl} < I_{sAmplMin} \Rightarrow I_{sdRefNeu} = -\sqrt{I_{sAmplMin}^2 - I_{sqRef}^2} \quad \text{(Eq. 10)},$$

$$I_{sAmpl} \geq I_{sAmplMin} \Rightarrow I_{sdRefNeu} = I_{sdRef} \quad \text{(Eq. 11)},$$

wherein $I_{sdRef}$ is the d-target current originally required by the FOR.

Figure 2:
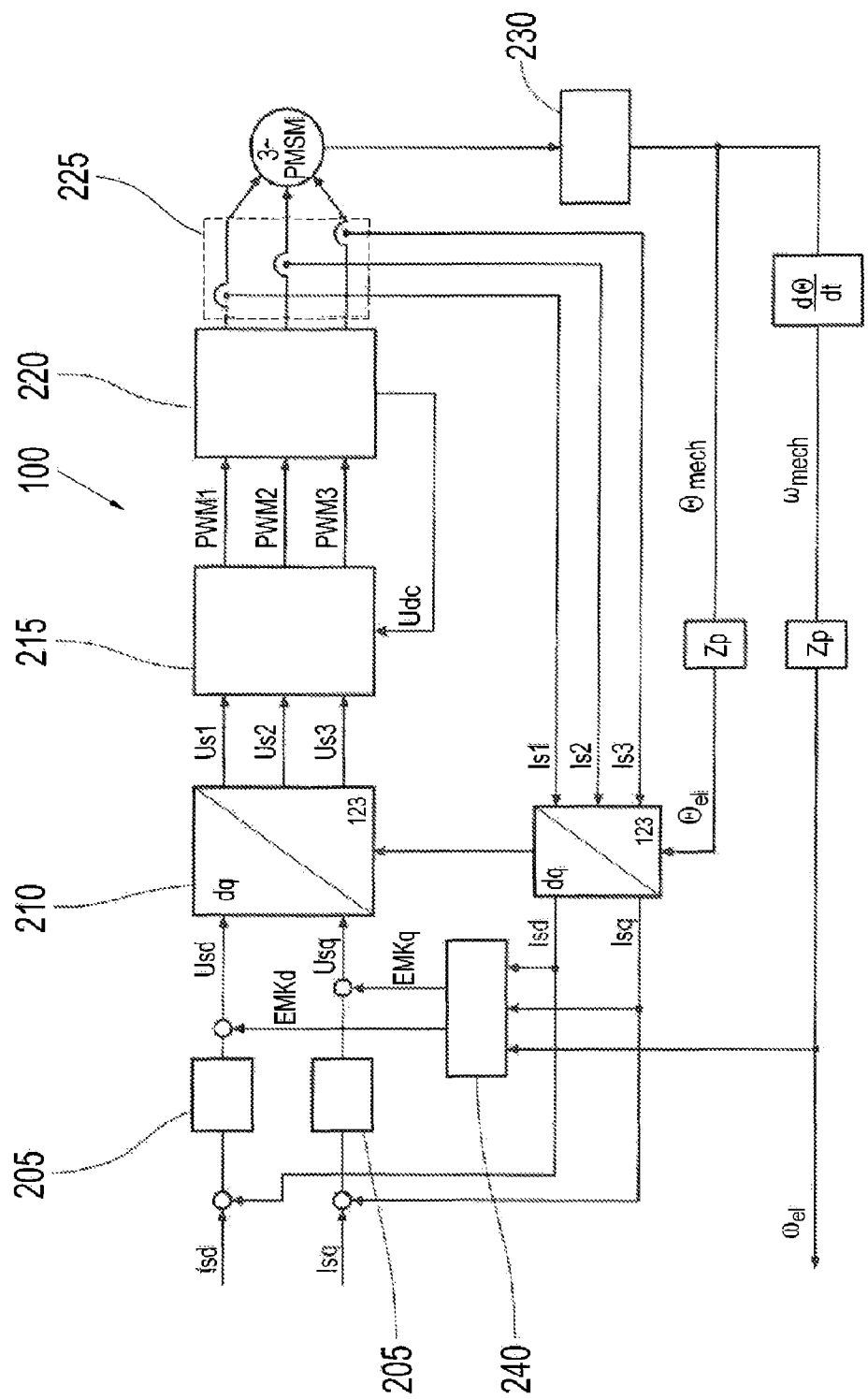
FIG. 2 shows a block diagram of a FOR of a PSM with decoupling.
Figure 4:
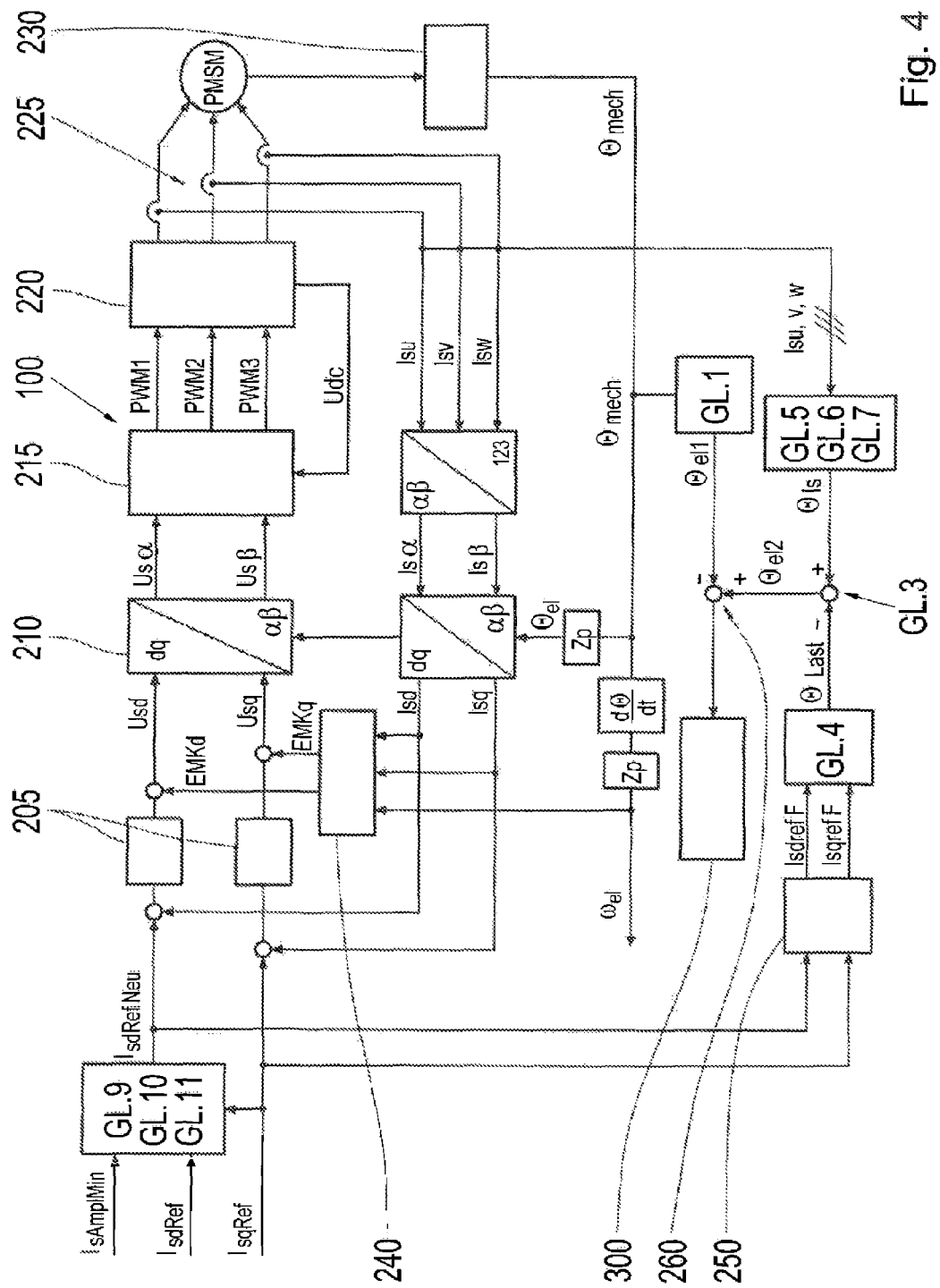
FIG. 4 shows a block diagram of a FOR of a PSM with a monitoring of the rotor position according to at least one embodiment of the present disclosure.

FIG. 4 shows the FOR shown in FIG. 2 with the expanded monitoring of the rotor position sensor and the behavior of the drive via the comparison of the electrical angle of the machine in a low rotational rate range, as well as at a standstill. Using Equation 1, the electrical angle $\theta_{el1}$ of the machine is calculated directly thereby, via a first method, via the measured mechanical rotor position $\theta_{mech}$ and the pole-pair number $Z_p$ of the PSM machine 100.

The electrical angle $\theta_{el2}$ of the machine is calculated by a second method based on the phase currents $I_{su}$, $I_{sv}$, $I_{sw}$ and the current target values $I_{sdRefF}$, $I_{sqRefF}$ filtered by means of the filter 250, or the new target current value $I_{sdRefNeu}$ corrected via the Equations 9 to 11, Eq. 9, Eq. 10, Eq. 11, instead of the target current value $I_{sdRefF}$ of the machine in the d, q-coordinate system via Eq. 4, Eq. 6, and Eq. 7. Because the FOR always has sufficient voltage in reserve in the low rotational rate range and at a standstill, the required d, q-target currents are adjusted with a set desired dynamic. In order to not use data regarding the mechanical angle $\theta_{mech}$ in the second calculation of the electrical angle $\theta_{el}$, the reproduced d,q-currents $I_{sdRefF}$, $I_{sqRefF}$ are used. The reproduction of the d, q-currents is obtained via at least one filter 250, which depict(s) the same dynamic of the regulator in the respective axis (d, q). The expected d, q-currents, and thus the expected load angle, can be determined with the filtered d, q-target currents $I_{sdRefF}$, $I_{sqRefF}$ (see Equation 4). The angle (or phase) of the phase current indicator $\theta_{Is}$ is determined by means of the measured phase currents, using the Equations 5 to 7. The estimated electrical angle $\theta_{el2}$ of the machine is obtained by means of Equation 3, Eq. 3, which is compared 260 with the electrical angle $\theta_{el1}$ calculated directly from Equation 1, Eq. 1. If the two angles are identical, or have only very slight deviations, i.e. are within defined tolerance limits, then the rotor position sensor 240 is functioning correctly, and the regulation of the machine 100 is functioning without error.

If larger deviations are observed, i.e. a pre-defined threshold value has been exceeded, for example, this deviation can be evaluated through a monitoring level 300. There are different methods for evaluating the deviations, e.g. taking an average, integration of the deviations over time, etc., for detecting malfunctions, and there are also different reactions to the respective detected deviation, or error. When a malfunction has been discovered, the drive can be shut off, in order to avoid causing an uncontrolled state, or a readjustment can occur. The measures taken are dependent on the application and are determined by a person skilled in the art.

Figure 5:
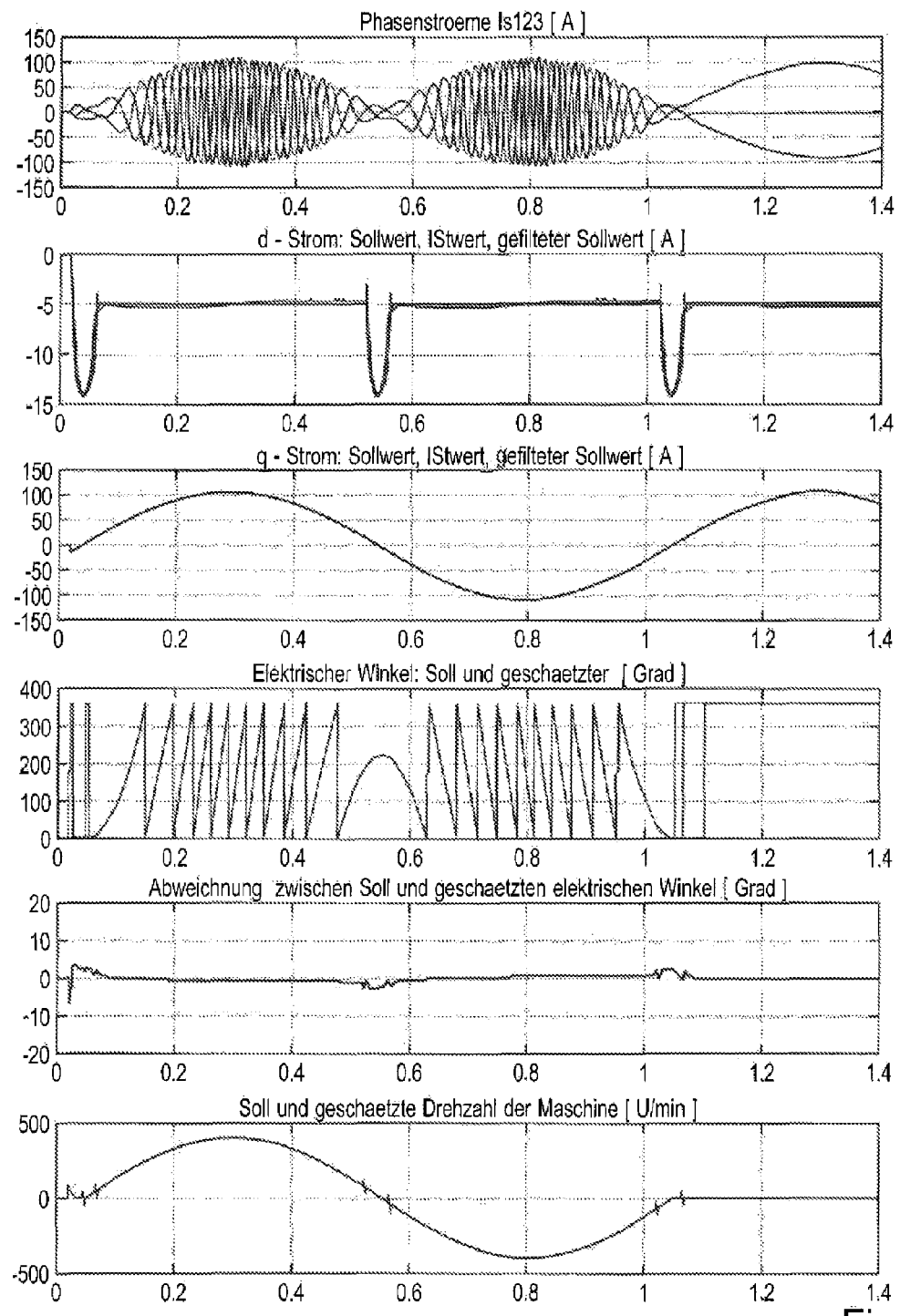
FIG. 5 shows curves of a simulation at the control of FIG. 4, without errors, according to at least one embodiment of the present disclosure.

FIG. 5 shows curves of a simulation on the control from FIG. 4 without error according to at least one embodiment of the present disclosure. The unit of the X-axis is seconds in FIGS. 5-7. It can be seen in FIG. 5 that the d, q-currents from the machine (second and third image) follow the target value, and conform to the filtered d, q-currents. The d-current target value is increased over time in order to maintain the minimum value of the phase current amplitude. The two electrical angles from Eq. 1 and Eq. 2 are identical, and have only very slight deviations (fourth and fifth image). The same applies for the estimated rotational rate and for the rotational rate calculated directly from the position sensor (sixth image). The deviations are negligible.

Figure 6:
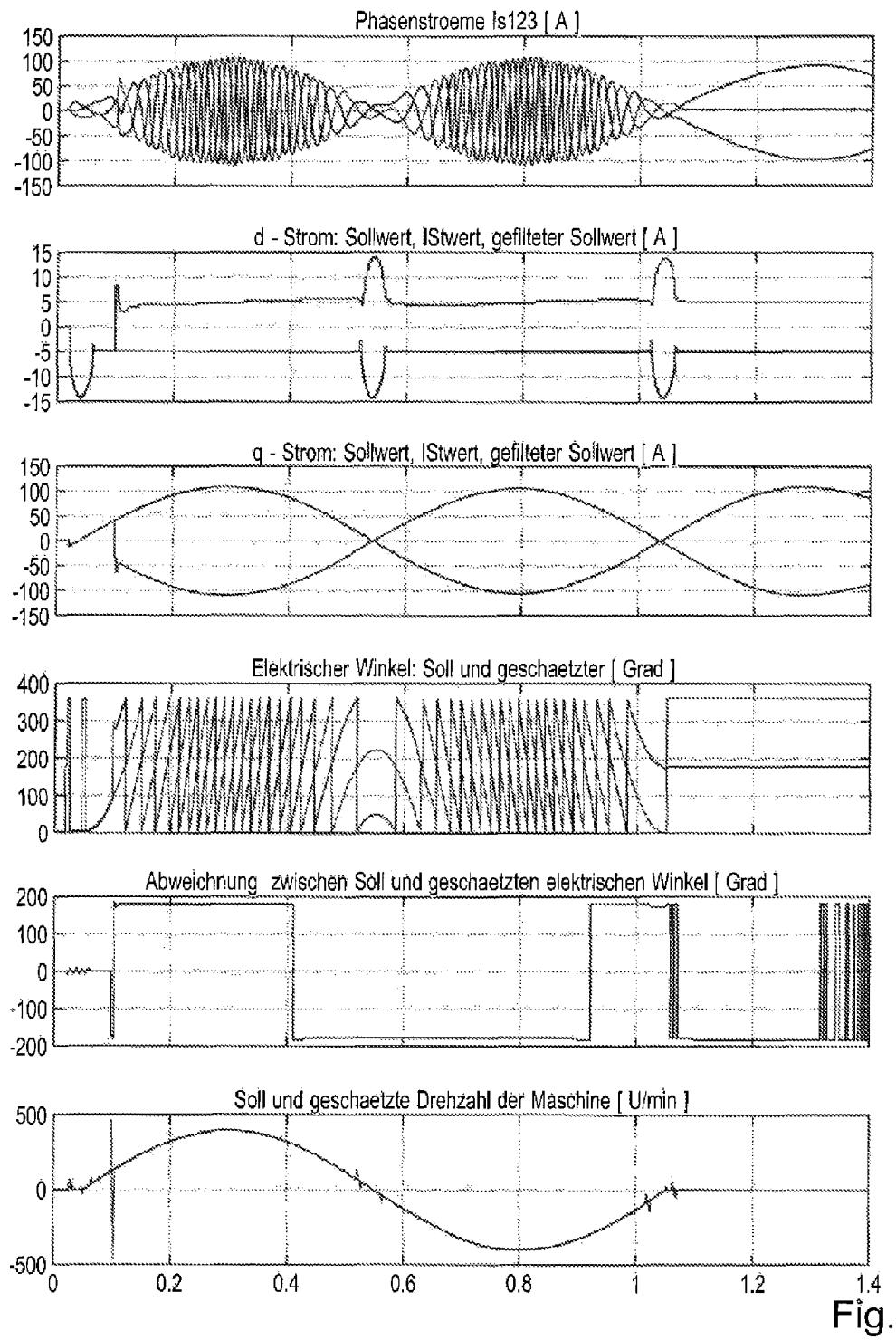
FIG. 6 shows curves of a simulation at the control of FIG. 4, with an offset error of 180° in the electrical angle, according to at least one embodiment of the present disclosure.

FIG. 6 shows curves of a simulation on the control from FIG. 4, with an offset error of 180° in the electrical angle according to at least one embodiment of the present disclosure. The sequence of the images of the measurement corresponds to that in FIG. 5. The simulation was run under the same conditions as in FIG. 5, wherein, in addition, an error in the rotor position sensor at the point in time t=0.1 s is reproduced in the simulation runtime. Such an offset in the angle can occur through the slipping of the sensor on the shaft of the machine. In this case, the extreme case is depicted, and an offset of 180° in the electrical angle is simulated, corresponding to an offset of 36° of the mechanical rotor position with a pole-pair number of Zp=5. It can be seen that the d, q-actual currents of the machine starting at t=0.1 s run in the opposite direction, compared to the d, q-target currents, although the filtered target currents have the same direction as the target currents. This can lead to a dangerous state, i.e. that, e.g., instead of an acceleration, a braking occurs, i.e. the machine runs in the wrong direction. It can further be seen that the estimated electrical angle has a difference of ±180°, which is conveyed to the monitoring level, such that a quick reaction of the monitoring level to this state is enabled, and a suitable measure can be taken in a timely manner.

Figure 7:
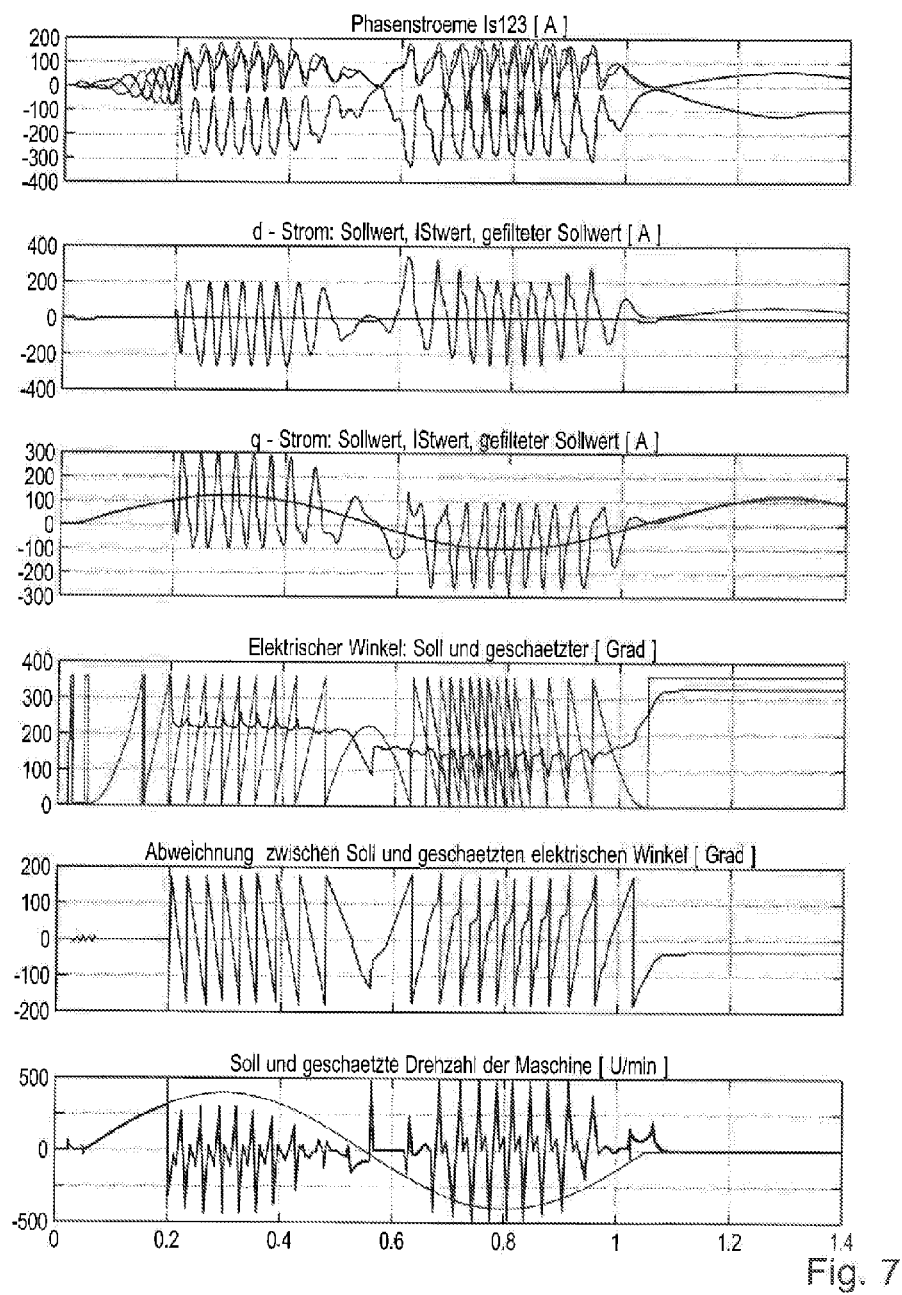
FIG. 7 shows curves of a simulation at the control of FIG. 4, with an error in the inverter, according to at least one embodiment of the present disclosure.

FIG. 7 shows curves of a simulation on the control from FIG. 4, with an error in the inverter according to at least one embodiment of the present disclosure. The simulation was run under the same conditions as in FIG. 5, wherein, additionally, an error in the inverter at the point in time t=0.2 s in the simulation runtime has been reproduced. The sequence of the images of the measurement corresponds to that in FIG. 5 and FIG. 6. In this case, the upper MOSFET is permanently short-circuited in phase U at the point in time t=0.2 s. It can be seen that the d, q-actual currents of the machine starting at t=0.2 s attain an uncontrolled state, and they no longer follow the d, q-target currents. This can lead to a dangerous state, e.g. that the machine runs in the wrong direction. The phase currents increase, which can lead to damage to the inverter. Furthermore, the machine can suffer permanent damage due to partial or entire demagnetization of the rotor. The estimated electrical angle exhibits a large difference, which is conveyed to the monitoring level, by means of which a quick reaction of the monitoring level to this state is enabled, such that a quicker protection of the drive is enabled.

As can be seen from the exemplary simulations, the concept for monitoring the electrical angle of the machine that has been developed can detect errors not only in the rotor position, but also in the inverter (e.g. MOSFET short circuit, MOSFET malfunctions, etc.) or the machine (e.g. phase interruptions, short circuits in the windings, etc.), such that corresponding measures for protecting the drive can also be taken in a timely manner.

Diagnosis possibilities for monitoring the overall drive are important for the safety of the product, as well as for fulfilling certain standards for the certification. With the present concept, the electrical angle of the machine (and thus the rotor position sensor) can also be monitored when the motor is at a standstill, or running in a low rotational rate range, which could not be done with the methods known so far in a simple and unimpeded manner. As a result of the present concept, an implanting of high-frequency signals (acoustic problem) is no longer necessary, unlike with injection methods. As a result, costs for expensive current sensors, quick and expensive A/D converters, and microcontrollers, etc., for example, are eliminated. Through the monitoring of the electrical angle of the machine in the entire rotational rate range, i.e. even at low rotational rates and at a standstill, a safer and improved monitoring is achieved in relation to conventional EMF-based methods. In addition, the functionality of the rotor position sensor can be monitored well, and errors can be detected in a timely manner, such that suitable measures can be taken quickly, in order to avoid uncontrolled and dangerous states due to errors that occur, or through a malfunction of the rotor position sensor.

REFERENCE SYMBOLS

100 induction machine
101 rotor
102 rotational axis
103 permanent magnet
$\vec{I}_s$ current indicator or current vector U, V, W phases
$\Psi_{PM}$ flux of the permanent magnet
$\Theta_{el1}$ electrical angle of the machine, calculated via Eq. 1
$\Theta_{el2}$ electrical angle of the machine, calculated via Eq. 2
$\Theta_{mech}$ mechanical angle of the machine, calculated via Eq. 4-7
205 control component
210 converter
215 vector modulator
220 pulse inverter
225 sampling device/current sensors
230 position sensor
240 decoupling device
250 filter
260 comparison device
300 monitoring level
$Z_P$ pole-pair number of the machine
Eq. 1 calculation of $\Theta_{el1}$ based on $\Theta_{mech}$ and the pole-pair number $Z_P$
Eq. 3-7 calculation of $\Theta_{el2}$ based on the phase current and regulated target currents in the d, q-coordinate system
Eq. 9-11 calculation of the new Isd target value $I_{sdRefNeu}$ based on the minimum current $I_{sAmplMin}$ in the machine.

APPENDIX

GLOSSARY FOR THE DRAWINGS

| | |
|---|---|
| GL. | Eq. (Equation) |
| Phasenstroeme | Phase currents |
| Strom | current |
| Sollwert | target value |
| Istwert | actual value |

APPENDIX-continued

GLOSSARY FOR THE DRAWINGS

| | |
|---|---|
| gefilteter Sollwert | filtered target value |
| Elektrischer Winkel | electrical angle |
| Soll und geschaetzter (Grad) | target and estimated (degree) |
| Abweichung zwischen Soll und geschaetzten elektrischen Winkel | Deviation between target and estimated electrical angle |
| Soll und geschaetzte Drehzahl der Maschine | Target and estimated rotational rate of the machine |

I claim:

1. A method for monitoring a rotor position sensor of a PSM machine having at least three phases operated by a field oriented control, wherein the electrical angle (Θel) of the PSM machine corresponds with a rotor position, the method comprising:
   a first calculation of the electrical angle ($\Theta_{el1}$) of the PSM machine, wherein the first calculation is based on a measured mechanical rotor position and the pole-pair number of the PSM machine;
   a second calculation of the electrical angle ($\Theta_{el2}$) of the PSM machine, wherein the second calculation is based on the phase of a phase current indicator and regulated target currents in the d,q-coordinate system; and
   a comparison of the values of the respective electrical angles ($\Theta_{el1}$, $\Theta_{el2}$) of the PSM machine determined by the first calculation and the second calculation.

2. The method according to claim 1, wherein the electrical angle ($\Theta_{el1}$) is calculated with the first calculation as follows:

$$\theta_{el} = Z_P \cdot \theta_{mech},$$

wherein $Z_P$ is the pole-pair number of the PSM machine and $\Theta_{mech}$ is the measured mechanical rotor position, and wherein the electrical angle ($\Theta_{el2}$) is calculated with the second calculation is calculated as follows:

$$\theta_{el2} = \theta_{Is} - \theta_{Last},$$

wherein $\Theta_{Last}$ is the load angle of the regulated target currents in the d,q-coordinate system, and $\Theta_{Is}$ is the phase of the phase current indicator of the PSM machine.

3. The method according to claim 2, wherein the load angle $\Theta_{Last}$ is calculated as follows:

$$\theta_{Last} = \arctan\left(\frac{I_{sdRefF}}{I_{sdRefF}}\right),$$

wherein $I_{sdRefF}$ and $I_{sqRefF}$ are delayed target values of the d,q-currents, and the phase of the current indicator $\Theta_{Is}$ is calculated as follows:

$$I_{sw} = -I_{su} - I_{sv},$$

wherein $I_{sw}$, $I_{su}$, and $I_{sv}$ are phase currents of the at least three phases, and the current components $I_{s\alpha}$ and $I_{s\beta}$ are in a α,β-coordinate system and are obtained from the transformation of the phase currents of the PSM machine follows:

$$\begin{pmatrix} I_{s\alpha} \\ I_{s\beta} \end{pmatrix} = \begin{pmatrix} \frac{2}{3} & -\frac{1}{3} & -\frac{1}{3} \\ 0 & \frac{1}{\sqrt{3}} & -\frac{1}{\sqrt{3}} \end{pmatrix} \begin{pmatrix} I_{su} \\ I_{sv} \\ I_{sw} \end{pmatrix},$$

and wherein the phase of the current indicator $\Theta_{Is}$ is determined therefrom as follows:

$$\theta_{Is} = \arctan\left(\frac{I_{s\alpha}}{I_{s\beta}}\right).$$

4. The method according to claim 1, wherein a pre-defined minimum current ($I_{sAmplMin}$) is applied to the machine in order to determine a load angle $\Theta_{Last}$ and a phase $\Theta_{Is}$ of the phase current indicator, wherein the minimum current ($I_{sAmplMin}$) is calculated on the basis of a current amplitude ($I_{sAmpl}$) of the PSM machine and the target currents ($I_{sdRef}$, $I_{sqRef}$) in the q,t-coordinate system as follows:

$$I_{sAmpl} = \sqrt{I_{sdRef}^2 + I_{sqRef}^2} \quad \text{(Eq. 9)},$$

wherein, when $I_{sAmpl} < I_{sAmplMin}$, a new $I_{sd}$-target current is defined:

$$I_{sAmpl} < I_{sAmplMin} \Rightarrow I_{sdRefNeu} = -\sqrt{I_{sAmplMin}^2 - I_{sqRef}^2} \quad \text{(Eq. 10)},$$

wherein, when $I_{sAmpl} \geq I_{sAmplMin}$, the new $I_{sd}$-target current is defined as follows:

$$I_{sAmpl} \geq I_{sAmplMin} \Rightarrow I_{sdRefNeu} = I_{sdRef} \quad \text{(Eq. 11)},$$

wherein $I_{sdRef}$ is the originally required d-target current and $I_{sdRefNeu}$ is the re-calculated d-target current for maintaining the minimum current $I_{sAmplMin}$ in the machine.

5. The method according to claim 1, wherein the comparison of the two determined electrical angles ($\Theta_{el1}$, $\Theta_{el2}$) occurs through taking the difference of the values for the electrical angle ($\Theta_{el1}$, $\Theta_{el2}$) determined with the first and second calculations.

6. The method according to claim 1, wherein, when it has been detected that a deviation between the determined electrical angles ($\Theta_{el1}$, $\Theta_{el2}$) exists, an evaluation of the deviation occurs to determine an error.

7. The method according to claim 6, wherein, if an error is detected, at least one of the following measures is taken: transmission of an error signal, shutting off the machine, and modifying the machine parameters.

8. An assembly for monitoring a PSM machine having at least three phases operated by a field oriented control, the assembly comprising:
   at least one position sensor configured to determine the rotor position ($\Theta_{mech}$) of the PSM machine;
   a sampling device for sampling the phase current of at least one of the phases;
   an execution device for performing at least a first calculation and a second calculation, wherein the first calculation and the second calculation independently determine the rotor position of the PSM machine; and
   a monitoring device, the monitoring device configured to evaluate errors when a deviation is detected between the determined rotor position as respectively determined by the first calculation and the second calculation.

9. The assembly according to claim 8, wherein the execution device comprises:
   a first device for performing the first calculation,
   a second device for performing the second calculation; and
   a comparison device configured to compare the respective electrical angles calculated with the first and second calculations.

10. The assembly according to claim 9, wherein the execution device includes the monitoring device.

11. The assembly according to claim 8, wherein the first calculation is based on a measured mechanical rotor position and the pole-pair number of the PSM machine.

12. The assembly according to claim 11, wherein the second calculation is based on the phase of a phase current indicator and regulated target currents in the d,q-coordinate system.

13. The assembly according to claim 12, wherein a first electrical angle ($\Theta_{el1}$) is calculated with the first calculation as follows:

$$\theta_{el1} = Z_P \cdot \theta_{mech},$$

wherein $Z_P$ is the pole-pair number of the PSM machine and $\Theta_{mech}$ is the measured mechanical rotor position.

14. The assembly according to claim 13, where a second electrical angle ($\Theta_{el2}$) is calculated with the second calculation is calculated as follows:

$$\theta_{el2} = \theta_{Is} - \theta_{Last},$$

wherein $\Theta_{Last}$ is the load angle of the regulated target currents in the d,q-coordinate system, and $\Theta_{Is}$ is the phase of the phase current indicator of the PSM machine.

15. The assembly according to claim 14, wherein the load angle $\Theta_{Last}$ is calculated as follows:

$$\theta_{Last} = \arctan\left(\frac{I_{sdRefF}}{I_{sdRefF}}\right),$$

wherein $I_{sdRefF}$ and $I_{sqRefF}$ are delayed target values of the d,q-currents, and the phase of the current indicator $\Theta_{Is}$ is calculated as follows:

$$I_{sw} = -I_{su} - I_{sv},$$

wherein $I_{sw}$, $I_{su}$, and $I_{sv}$ are phase currents of the at least three phases, and the current components $I_{s\alpha}$ and $I_{s\beta}$ are in a $\alpha,\beta$-coordinate system and are obtained from the transformation of the phase currents of the PSM machine follows:

$$\begin{pmatrix} I_{s\alpha} \\ I_{s\beta} \end{pmatrix} = \begin{pmatrix} \frac{2}{3} & -\frac{1}{3} & -\frac{1}{3} \\ 0 & \frac{1}{\sqrt{3}} & -\frac{1}{\sqrt{3}} \end{pmatrix} \begin{pmatrix} I_{su} \\ I_{sv} \\ I_{sw} \end{pmatrix},$$

and wherein the phase of the current indicator $\Theta_{Is}$ is determined therefrom as follows:

$$\theta_{Is} = \arctan\left(\frac{I_{s\alpha}}{I_{s\beta}}\right).$$

16. The assembly according to claim 8, wherein detecting the deviation includes taking the difference of the values for the electrical angle determined with the first and second calculations.

* * * * *